(12) United States Patent
Zhang

(10) Patent No.: US 11,523,479 B2
(45) Date of Patent: Dec. 6, 2022

(54) LOAD DRIVING CIRCUIT, DRIVING METHOD AND ASSOCIATED SWITCH CONTROL CIRCUIT

(71) Applicant: Shenzhen Kiwi Instruments Corporation, Shenzhen (CN)

(72) Inventor: Bo Zhang, Hangzhou (CN)

(73) Assignee: Shenzhen Kiwi Instruments Corporation, Nanshan Dist. (CN)

(*) Notice: Subject to any disclaimer, the term of this patent is extended or adjusted under 35 U.S.C. 154(b) by 105 days.

(21) Appl. No.: 17/134,064

(22) Filed: Dec. 24, 2020

(65) Prior Publication Data
US 2021/0120642 A1   Apr. 22, 2021

(30) Foreign Application Priority Data
Dec. 30, 2019   (CN) .......................... 201911390862.9

(51) Int. Cl.
| | |
|---|---|
| H05B 45/14 | (2020.01) |
| H05B 45/325 | (2020.01) |
| H05B 45/375 | (2020.01) |
| H03K 3/012 | (2006.01) |
| H02J 7/16 | (2006.01) |
| H05B 45/30 | (2020.01) |

(52) U.S. Cl.
CPC ................ *H05B 45/14* (2020.01); *H02J 7/16* (2013.01); *H03K 3/012* (2013.01); *H05B 45/30* (2020.01); *H05B 45/325* (2020.01); *H05B 45/375* (2020.01)

(58) Field of Classification Search
CPC ...... H05B 45/14; H05B 45/30; H05B 45/325; H05B 45/375; H05B 45/395; H02J 7/16; H03K 3/012; Y02B 20/30; H02M 3/156; H02M 1/08
See application file for complete search history.

(56) References Cited

U.S. PATENT DOCUMENTS

| | | | |
|---|---|---|---|
| 2017/0325302 A1* | 11/2017 | Elferich | H05B 45/14 |
| 2018/0092172 A1* | 3/2018 | Yoo | H05B 45/46 |
| 2018/0115234 A1* | 4/2018 | Liu | H05B 45/3575 |

* cited by examiner

*Primary Examiner* — Daniel D Chang
(74) *Attorney, Agent, or Firm* — Perkins Coie LLP

(57) ABSTRACT

A load driving circuit includes a switch circuit and a linear circuit connected in series. The switch circuit has a switching transistor and converts an input voltage into a first output voltage. The linear circuit has a linear device and provides a driving voltage and a driving current for driving the load. The driving circuit controls the switching transistor according to a feedback signal indicative of conducting state of the linear device.

16 Claims, 5 Drawing Sheets

LOAD DRIVING CIRCUIT, DRIVING METHOD AND ASSOCIATED SWITCH CONTROL CIRCUIT

CROSS-REFERENCE TO RELATED APPLICATIONS

This application claims priority to and the benefit of Chinese Patent Applications No. 201911390862.9, filed on Dec. 30, 2019, which are incorporated herein by reference in its entirety.

TECHNICAL FIELD

The present invention relates generally to electronic field, and more particularly but not exclusively relates to load driving circuit, driving method and associated switch control circuit.

BACKGROUND

At present, the LED driver chips can be divided into constant voltage driver chip, constant current driver chip, and pulse driver chip. Wherein the advantage of constant voltage driver chip is that the chip is cheap and the peripheral circuit is simple. However, the constant voltage driver chip cannot control the driving current for the load and cannot guarantee the consistency of the LED brightness.

The constant current driver chip controls the switch circuit based on the output current. The constant current driver chip can control the driving current for the load, and can flexibly set the current value of the required output. While the price of the constant current driver chip is higher than that of the constant voltage driver chip. And the peripheral circuit of the constant current driver chip is more complex than that of the constant voltage driver chip. In addition, if there are multiple loads, it is not suitable to regulate the currents of partial loads for toning.

The pulse driver chip supplies power to the LED lamp by an output interface of the high frequency pulse generator. However, this method has stroboscopic, and the driving ability is only suitable for low power applications.

SUMMARY

In one embodiment, a load driving circuit comprises a switch circuit and a linear circuit. The switch circuit has a switching transistor. The switch circuit is configured to convert an input voltage into a first output voltage based on a switching action of the switching transistor. The linear circuit has a linear device. The linear circuit is coupled to the switch circuit, and the linear circuit is configured to provide a driving voltage and a driving current for the load. Wherein the driving circuit is configured to control the switching transistor based on a feedback signal indicative of a conducting state of the linear device.

In another embodiment, a method for driving a load comprises: converting an input voltage into a first output voltage by a switch circuit; coupling a linear circuit in series with the switch circuit; providing a driving voltage and a driving current for a load based on a driving state of the linear circuit, wherein the driving voltage is a voltage difference between two ends of the load; and controlling the switch circuit based on a driving state of the linear circuit.

In yet another embodiment, a switch control circuit is configured to control a switching transistor of a switch circuit, the switch circuit is configured to couple in series with a linear circuit for driving a load, the switch circuit is configured to control the switching transistor according to a feedback signal indicative of a driving state of the linear circuit.

BRIEF DESCRIPTION OF THE DRAWINGS

Non-limiting and non-exhaustive embodiments are described with reference to the following drawings. The drawings are only for illustration purpose. Usually, the drawings only show part of the devices of the embodiments.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Throughout the specification and claims, the term "couple" as used herein, is defined as either directly, or indirectly connecting one to another via intermediary such as via electrical conducting materials which may have resistance, parasitic inductance or capacitance, or via other material(s) or component(s) as would be known to person skilled in the art without departure from the spirit and scope of the invention as defined by the appended claims.

Accordingly, improved load driving circuit, driving method and associated switch control circuit is required to address one or more deficiencies in the above approaches.

Figure 1:
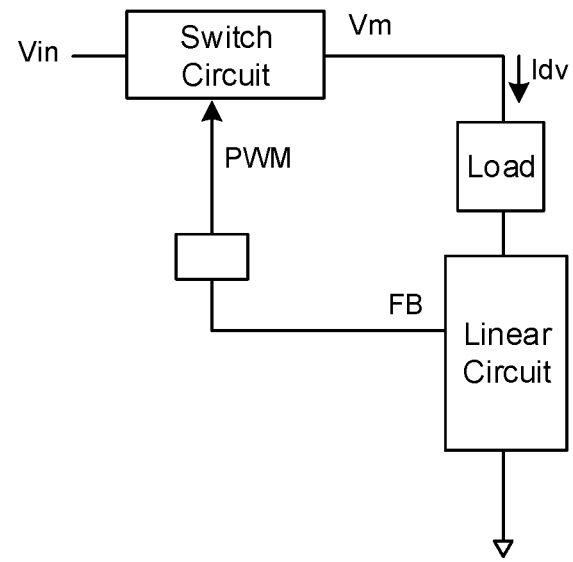
FIG. 1 illustrates a structure diagram of a load driving circuit according to an embodiment of the present invention.
Figure 5:
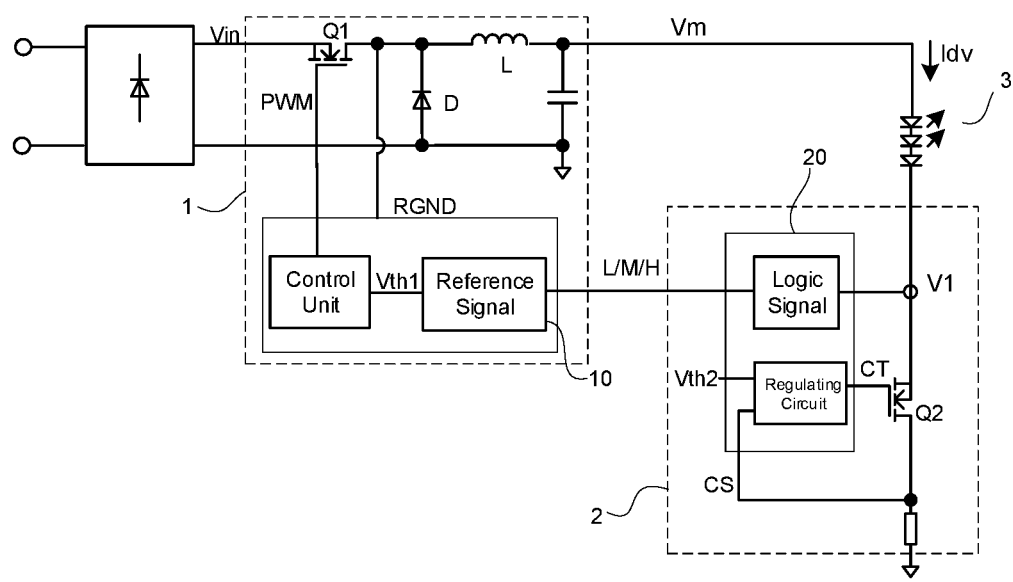
FIG. 5 illustrates a circuit diagram of a load driving circuit according to an embodiment of the present invention.

FIG. 1 illustrates a structure diagram of a load driving circuit according to an embodiment of the present invention. The load driving circuit comprises a switch circuit and a linear circuit. Wherein the switch circuit comprises a switching transistor. The input of the switch circuit is configured to receive the input voltage Vin. The output of the switch circuit is configured to provide the first output voltage Vm. The switch circuit is configured to convert the input voltage Vin into the first output voltage Vm according to the switching action of the switching transistor. In one embodiment, the input voltage Vin is the voltage signal which is obtained by rectifying and filtering the mains power voltage. In one embodiment, the switch circuit comprises a buck converter, such as Buck circuit, as shown in FIG. 5. The switch circuit can also be other types of switch converter which comprises a switching transistor, such as Buck-boost circuit. It is adjusted the first output voltage Vm by controlling the conducting state of the switching transistor. The conducting state of the switching transistor is regulated by the duty cycle of the PWM signal.

The linear circuit includes a linear device that is coupled in series with the load. As a back stage circuit, the linear circuit is coupled to the front stage switch circuit. The linear circuit provides the driving voltage and the driving current Idv for the load according to the first output voltage Vm and the conducting state of the linear device, wherein the driving voltage is the voltage difference between two ends of the load. As shown in FIG. 5, the load is coupled between the switch circuit and the linear circuit. In another embodiment, the position of the load and the linear circuit is also interchangeable.

In an embodiment, the driving circuit comprises a switch control circuit. The input of the switch control circuit is coupled to the linear circuit, which is configured to obtain the feedback signal FB. The output of the switch control circuit provides the PWM signal, and is coupled to the control end of the switching transistor. The driving circuit is configured to control the switching transistor in accordance with the feedback signal FB which is related with the conducting state of the linear device of the linear circuit, and then adjusts the first output voltage Vm. The feedback signal FB can reflect the driving state of the linear circuit, which is related with the conducting state of the linear device of the linear circuit. In an embodiment, it allows the linear device to work at low on-resistance status according to the feedback signal which is related with the conducting state of the linear device of the linear circuit. Therefore, the output voltage Vm of the switch circuit adjusts adaptively in accordance with the working status of the linear circuit, which is configured to reduce the power consumption of the linear device and to improve the efficiency of the system.

Figure 6:
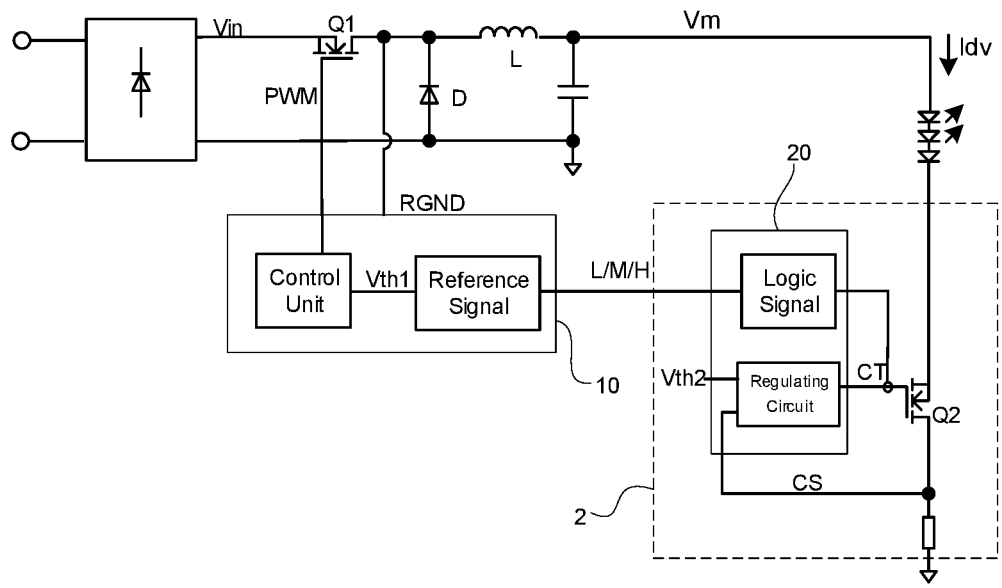
FIG. 6 illustrates a circuit diagram of a load driving circuit according to another embodiment of the present invention.

In an embodiment, the feedback signal is the driving signal which is configured to drive the linear device. For example, the output of the switch control circuit is coupled to the control end of the linear device for obtaining the gate driving signal of the linear device. When the gate driving signal increases, the conducting degree of the linear device increases, and when the gate driving signal decreases, the conducting degree of the linear device decreases. As shown in FIG. 6, the driving signal CT is used as the feedback signal to control the switch circuit.

In an embodiment, the feedback signal FB is the difference value signal which represents the difference value between the first output voltage Vm and the driving signal of the load. For example, the input of the switch control circuit is coupled to the high voltage end of the linear device, as shown in FIG. 5, and the input of the switch control circuit is configured to receive the feedback signal V1. When the difference value between the first output voltage Vm and the driving voltage increases, the voltage difference between two ends of the linear device increases, the conducting degree of the linear device decreases, and the on-resistance increases. When the difference value between the first output voltage Vm and the driving voltage decreases, the voltage difference between two ends of the linear device decreases, the conducting degree of the linear device increases, the on-resistance decreases. In an embodiment, it controls the switch circuit to increase the first output voltage Vm when the feedback signal indicates that the conducting degree of the linear device is too large. It controls the switch circuit to decrease the first output voltage Vm when the feedback signal indicates that the conducting degree of the linear device is too low. Therefore, the switch circuit can be controlled adaptively by detecting the feedback signal which reflects the conducting state of the linear device for outputting the appropriate first output voltage, which can be used to improve the efficiency of the system.

Figure 7:
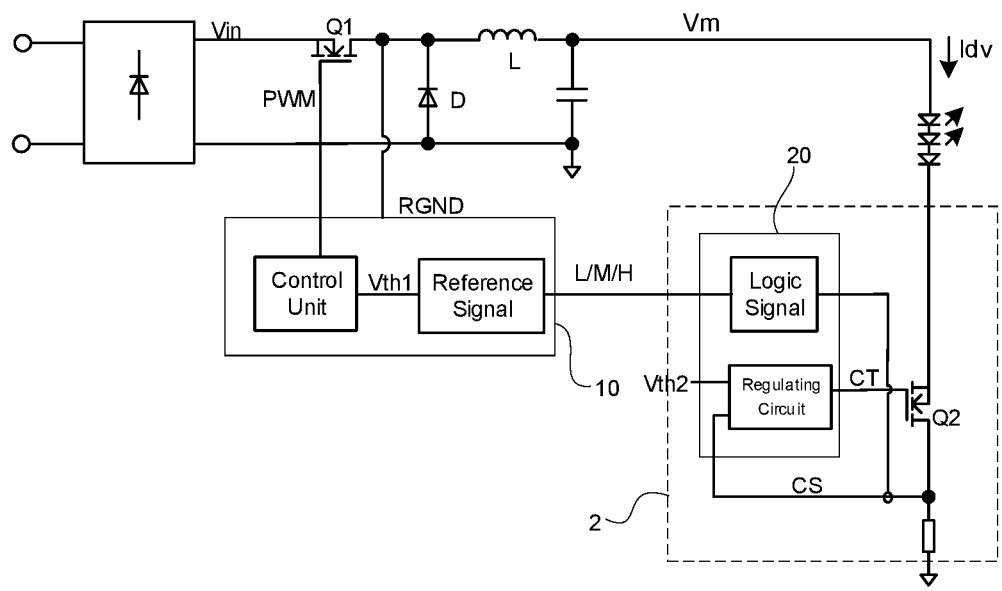
FIG. 7 illustrates a circuit diagram of a load driving circuit according to yet embodiment of the present invention.

In an embodiment, the feedback signal FB is the current sampling signal representing a current flowing through the linear device, the current sampling signal is as shown in FIG. 7.

Figure 2:
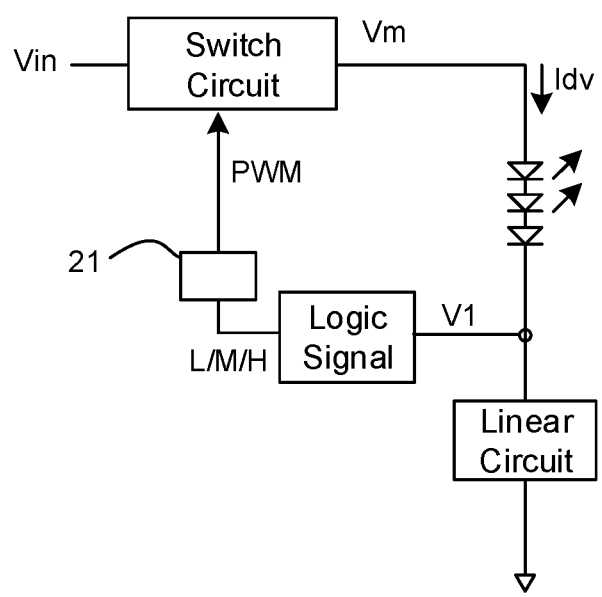
FIG. 2 illustrates a circuit diagram of a driving circuit according to an embodiment of the present invention.

FIG. 2 illustrates a circuit diagram of a driving circuit according to an embodiment of the present invention. In an embodiment, the feedback signal indicative of the conducting state of the linear device of the linear circuit is the voltage signal V1, which is obtained by sampling the high voltage end of the linear circuit. The voltage signal V1 is the difference value signal representing the difference value between the first output voltage Vm and the driving voltage of the load. In another embodiment, if the linear circuit is coupled between the switch circuit and the load, the feedback signal can be acquired by the difference operation in accordance with the first output voltage and the driving voltage of the load. When the voltage signal V1 increases, the voltage difference between two ends of the linear device increases, the conducting degree of the linear device decreases. When the voltage signal V1 decreases, the voltage difference between two ends of the linear device decreases, the conducting degree of the linear device increases. As shown in FIG. 2, the driving circuit obtains the voltage signal V1 and generates the logic signal (L/M/H) based on the voltage signal V1. The driving circuit is further configured to output the control signal PWM for controlling the switching transistor of the switch circuit according to the logic signal. Without doubt, the logic signal can also be regarded as a feedback signal indicative of the conducting state of the linear device. The driving circuit may further include a linear control circuit, which is used to control the linear device of the linear circuit. The driving circuit can further comprise a switch control circuit, which is used to control the switching transistor of the switch circuit.

In an embodiment, the switch control circuit is fabricated on the first semiconductor substrate. The linear control circuit is fabricated on the second semiconductor substrate. In another embodiment, the logic signal is generated by the linear control circuit, and is provided to the switch control circuit. The switch control circuit 21 is configured to get the logic signal. Wherein if the logic signal is the first logic level, such as low level (L), the conducting degree of the linear device is great, the difference value between two ends of the linear device is low, the switch control circuit 21 controls the switching transistor to increase the first output voltage Vm. For example, it is increased the first output voltage Vm by increasing the duty cycle of the pulse width modulation signal. If the logic signal is the second logic level, such as high level (H), the conducting degree of the linear device is low, the switch control circuit 21 controls the switching transistor to decrease the first output voltage Vm. For example, it is decreased the first output voltage Vm by decreasing the duty cycle of the pulse width modulation signal. In another embodiment, the logic signal includes other statuses, for example, if the logic signal is the third logic level (M), it represents that the conducting degree of the linear device is moderate, and the driving circuit maintains the current status to control the switching transistor.

In an embodiment, the driving circuit comprises a logic signal generation circuit. The logic signal generation circuit provides the logic signal according to the voltage signal V1. In an embodiment, the logic signal generation circuit is fabricated in the linear control circuit.

In an embodiment, the switching control circuit further includes the reference setting circuit which generates the reference signal based on the logic signal, so that the first output voltage Vm changes with the reference signal. In an embodiment, if the logic signal is the first logic level, the reference signal is increased. It is adjusted the duty cycle of the PWM signal by the reference signal in order to keep the first output voltage Vm following the reference signal. If the logic signal is the second logic level, the reference signal remains unchanged. If the logic signal is the third logic level, the reference signal is decreased. In an embodiment, it adjusts or maintains the logic signal in every preset period. In another embodiment, if the logic signal is the first logic level, the reference signal representing the preset value of the first output voltage is set as the first reference signal. If the logic signal is the second logic level, the reference signal is set as the second reference signal. If the logic signal is the third logic level, the reference signal is set as the third reference signal.

In an embodiment, the switch circuit comprises a buck circuit, such as Buck circuit. In an embodiment, the control method of the buck circuit is based on the floating ground. The reference ground of the switch control circuit is coupled to the low voltage end of the switching transistor in the buck circuit, and the reference ground of the switch control circuit is different from the reference ground of the switch circuit or the linear control circuit. The feedback signal is converted to the logic signal, which is no need for complex transform processing for the feedback signal in the control of the switch control circuit based on the floating ground. It is used to reduce the complexity of the system.

In an embodiment, as shown in FIG. 2, the voltage signal V1 is the voltage signal of the coupling point which is between the linear circuit and the load. In an embodiment, when the voltage signal V1 decreases to a preset threshold, the logic signal is the first state which is used for increasing the first output voltage Vm. When the voltage signal is greater than the preset threshold, the logic signal is the second state which is used for decreasing the second output voltage Vm.

In an embodiment, the logic signal is generated by the minimum value of the voltage signal V1, which can ensure reliable driving, low power consumption and elevated system efficiency. It will be combined with the waveform of FIG. 4 to explain the beneficial effects.

In an embodiment, the generation conditions of the logic signal are shown in the table below.

TABLE 1

| V10 (the minimum value of V1 in the period) | Logic level |
|---|---|
| V10 < Vref1 | L |
| Vref1 < V10 < Vref2 | M |
| V10 > Vref2 | H |

When the minimum value V10 of the voltage signal V1 in the preset period is less than the first threshold Vref1, it is set the logic signal as the first logic level L for increasing the first output voltage Vm. When the minimum value V10 of the voltage signal V1 in the preset period is greater than the first threshold Vref1 and less than the second threshold Vref2, it is set the logic signal as the second logic level M for maintaining the first output voltage Vm or the current control. When the minimum value V10 of the voltage signal V1 in the preset period is greater than the second threshold Vref2, it is set the logic signal as the third logic level H for decreasing the first output voltage Vm. Thereinto, the first threshold Vref1 is less than the second threshold Vref2. In an embodiment, the first logic level L is a low level, the second logic level M is a high resistance status, and the third logic level H is a high level. In another embodiment, the logic signal can represent different logic states by different pulse signals. The logic signal can also represent the logic states by other forms. Of course, the logic signal generation circuit can output more logic states, which is not limited to two or three types. The switch circuit is controlled differently in the different logic states. The preset period can be the half of the period of mains power or the integral multiple of the half of the period of mains power. Wherein the period of mains power is the period of mains power AC supply. In practice, the period of mains power may be a period of slight swing due to the electromagnetic interference or signal pollution. The half of the period of mains power can also fluctuate slightly under the influence of various circuit factors.

In an embodiment, as shown in FIG. 2, the load comprises light-emitting diode (LED). Without doubt, the driving circuit is also used to drive other type loads. The driving voltage is corresponding to the load. It is controlled the first output voltage Vm by detecting the feedback signal which is related with the conducting state of the linear device. The first output voltage Vm can be adjusted adaptively to make the linear device work in the appropriate conducting state, so that the driving circuit can be adaptive to drive different loads in different situations. In an embodiment, as shown in FIG. 2, the voltage control of the front stage switch circuit can easily control the current feedback of the linear circuit, and the dimming function of the LED load can be realized stably.

Figure 3:
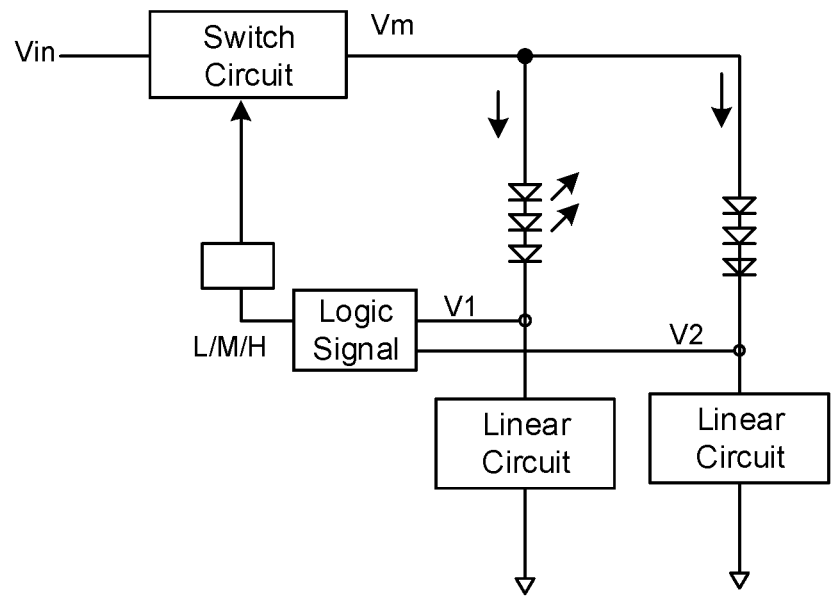
FIG. 3 illustrates a circuit diagram of a load driving circuit according to an embodiment of the present invention.

FIG. 3 shows a load driving circuit according to an embodiment of the present invention. The driving circuit comprises multiple linear circuits, each of which is coupled in series with the corresponding load. The driving circuit samples the feedback signals V1 and V2 in each linear circuit. The driving circuit generates the logic signal in accordance with the multiple feedback signals V1 and V2, which are used to drive the switching transistor in the switch circuit to further adjust the first output voltage Vm. In an embodiment, the feedback signals V1 and V2 are the difference signals between the corresponding first output voltage and the corresponding branch driving voltage respectively. In an embodiment, the logic signal generation circuit generates logic signal based on the smaller value of the feedback signals V1 and V2 to further control the first output voltage Vm. In an embodiment, the feedback signal V1 or V2 is the minimum value of the difference between the first output voltage and the corresponding driving voltage for the load. In an embodiment, the preset period is the half of the period of mains power.

Figure 4:
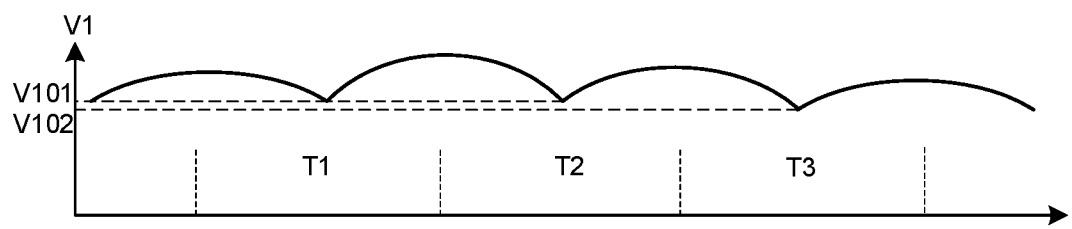
FIG. 4 illustrates a waveform diagram of a feedback signal according to an embodiment of the present invention.

FIG. 4 illustrates a waveform diagram of a feedback signal according to an embodiment of the present invention. Thereinto, the feedback signal V1 represents the voltage difference between two ends of the linear device, which is corresponding to the difference signal between the first output voltage Vm and the driving voltage of the load in FIG. 2. For the purpose of the power factor control, the waveform of the input current has the component following the mains power voltage waveform, which makes the first output voltage Vm present the ripple corresponding to the mains power rectification signal. The ripple period is corresponding to the half of the period of mains power. Therefore, the feedback signal V1 also shows a ripple of half of the period of mains power. In a comparative embodiment, the system controls the average value of the first output voltage, due to the first output voltage Vm has the ripple, when the average value of the first output voltage Vm has the ability to drive the load, the bottom value of the first output voltage Vm may be lower than the driving voltage of the load, so that the system cannot drive the load normally. In another comparative embodiment, in order to ensure that the system drives the load normally, the system increases the reference of the first output voltage Vm to a safety margin, however it is easy to cause the first output voltage Vm to be too large, so that the system efficiency is reduced. In an embodiment of the present invention, the system controls the switching transistor in accordance with the minimum value of the feedback signal V1 in each half of the period of mains power, such as V101 or V102. Specifically, the logic signal is generated according to the minimum value of the difference signal V1 between the first output voltage and the driving voltage of the load in each half of the period of mains power to control the switching transistor in the switching circuit. For example, the minimum value V101 is collected as the feedback signal in the period of T1 and T2, and the first output voltage Vm is adjusted by the minimum value V101. The minimum value V102 is sampled in the period T3, and the first output voltage Vm is adjusted by the minimum value V102. Therefore, it can be used to ensure that the load is normally driven at the valley value of the first output voltage Vm, and the first output voltage Vm will not be set too large, so that the system has high power factor and high efficiency.

FIG. 5 illustrates a circuit diagram of a load driving circuit according to an embodiment of the present invention. The load driving circuit includes a switch circuit 1 and a linear circuit 2. Wherein the switch circuit 1 comprises a switching transistor Q1. The switch circuit 1 converts the input voltage Vin into the first output voltage Vm in accordance with the switching action of the switching transistor Q1. The switch circuit 1 further includes a switch control circuit 10, which is used to control the switching action of the switching transistor Q1 in the switch circuit 1, so as to adjust the first output voltage Vm. For example, the conducting duty cycle of the switching transistor Q1 is controlled by the pulse width modulation (PWM) signal to adjust the first output voltage Vm. In an embodiment, the switching transistor Q1 includes metal-oxide-semiconductor field effect transistor (MOSFET). As it should be, the switching transistor Q1 can also be other type transistors that can work in the switching state, such as junction type field effect transistor (JFET) or other devices. In the illustrated embodiment, the switch circuit 1 includes the Buck circuit, wherein the first end of the switching transistor Q1 is used to receive the input voltage Vin. The control end of the switching transistor Q1 is coupled to the output of the switch control circuit 10. The second end of the switching transistor Q1 is coupled to the rectifier transistor D and the inductance L. Another end of the inductance L is coupled to the capacitor C to provide the first output voltage Vm. In the illustrated embodiment, the switch control circuit 10 is based on the floating control, the reference ground RGND of the switch control circuit 10 is coupled to the second end of the switching transistor Q1. The switch control circuit 10 controls the switching transistor Q1 according to the feedback signal (L/M/H) indicative of the driving state of the linear circuit 2.

Continuing with the description of FIG. 5, the linear circuit 2 includes a linear device Q2. The linear circuit 2 as the back stage circuit is coupled to the switch circuit 1 as the front stage circuit, which is used to provide the driving voltage and the driving current Idv for the load 3. Wherein the driving voltage is the difference value between two ends of the load 3. The linear circuit 2 further includes a linear control circuit 20, the linear control circuit 20 controls the linear device Q2 to work in the resistance variable area (linear area), which is used to control the conducting state of the linear device, so that the voltage difference between two ends of the linear device Q2 and the current flowing through the linear device Q2 are modulated. In the illustrated embodiment, the linear device Q2 includes metal-oxide-semiconductor field effect transistor (MOSFET). As it should be, the linear device Q2 can also be other type transistors or device that can work in the resistance variable area. The linear device Q2 is coupled in series with the load 3. In the illustrated embodiment, the linear control circuit 20 has a first input for receiving a current sampling signal CS representing the driving current, a second input for receiving the reference signal Vth2 and an output which is coupled to the control end of the linear device. The linear control circuit 20 outputs a driving signal CT to control the conducting degree of the transistor Q2, which controls the driving current Idv flowing through the linear device Q2 and the load 3. In an embodiment, the linear control circuit 20 comprises an error amplifier circuit. The error amplifier circuit controls the conducting degree of the linear device Q2 in accordance with the difference value between the current sampling signal CS and the reference signal Vth2 for realizing the accurate control of the driving current. In an embodiment, the load 3 includes the light-emitting diode (LED), and the linear control circuit 20 adjusts the brightness of LED by controlling the conducting degree of the linear device Q2. Specifically, the brightness of LED can be controlled by adjusting the reference signal Vth2. In a contrast embodiment, the linear circuit as the back stage circuit is coupled in series with the switch circuit as the front stage for driving the load, wherein the switch circuit controls the output current by the control of the current feedback. Because it is difficult to control the current of the front and rear stage circuits at the same time, the toning of LED load is realized by using the PWM signal to adjust the duty cycle of the transistor of the rear stage linear circuit respectively. However, there is strobe in the PWM regulation. In accordance with an embodiment of the present invention. The front stage switch circuit is a voltage type control circuit, and the rear stage linear circuit is a current type control circuit. The front and rear stage control processes can be carried out at the same time. Wherein the current reference signal Vth2 is an analog signal, and the current regulation mode doesn't use high frequency pulse signal, so that it will not cause stroboscopic. In addition, the current of each branch cannot be controlled separately when the current feedback control is used in the front stage switch circuit for the driving circuit with multiple loads, so as to realize the toning control. However, in an embodiment of the present invention, the driving circuit can control the current of the linear circuit in each branch to realize the toning control of the lighting load.

Continuing with the description of FIG. 5, the driving circuit generates a logic signal to control the switching transistor of the switch circuit 1 in accordance with the feedback signal V1 indicative of the conducting state of the linear device Q2. In the illustrated embodiment, the linear control circuit 20 comprises a logic signal generation circuit, and the logic signal generation circuit generates the logic signal based on the voltage signal V1. The switch control circuit 10 receives the logic signal, and controls the switching transistor Q1, in order to adjust the first output voltage Vm. In this case, the logic signal can be viewed as the feedback signal indicative of the driving state of the linear circuit. In another embodiment, the logic signal generation circuit is fabricated in the switch control circuit 10. The switch control circuit 10 includes a reference setting circuit, and the reference setting circuit generates a reference signal Vth1 according to the logic signal, and further generates a PWM signal in accordance with the reference signal Vth1 to control the switching transistor Q1, so that the first output voltage Vm changes with the reference signal Vh1. In an embodiment, the feedback signal V1 is the minimum value in the preset period, and the switch control circuit 10 controls the reference signal Vth1 based on the minimum value. The floating control of the switch control circuit 10 can be facilitated by using the logic signal.

FIG. 6 illustrates a circuit diagram of a load driving circuit according to another embodiment of the present invention. The feedback signal controlling the switch circuit is the driving signal CT driving the linear device Q2 in the linear circuit 2, or generated based on the driving signal CT, which is different from FIG. 5. The switch control circuit 10 controls the switch circuit in accordance with the logic signal. As it should be, the logic signal can be generated by the switch control circuit based on the driving signal CT. Wherein the logic signal can be set based on the driving signal CT. For example, if the driving signal CT is greater than the first threshold, it is set the logic signal as the low level for increasing the first output voltage Vm. If the driving signal CT is less than the second threshold, it is set the logic signal as the high level for decreasing the first output voltage Vm, wherein the first threshold is greater than the second threshold.

FIG. 7 illustrates a circuit diagram of a load driving circuit according to yet embodiment of the present invention. The feedback signal controlling the switch circuit is the current sampling signal CS representing the current flowing through the linear device in the linear circuit 2, or generated based on the signal CS, which is different from FIG. 5. In the illustrated embodiment, the logic signal (L/M/H) is generated by the linear control circuit in accordance with the current sampling signal CS. The switch control circuit 10 controls the switch circuit based on the logic signal. Without doubt, the logic signal can be generated by the switch control circuit 10 according to signal CS. Thereinto, the logic signal is set in accordance with the current sampling signal CS.

Figure 8:
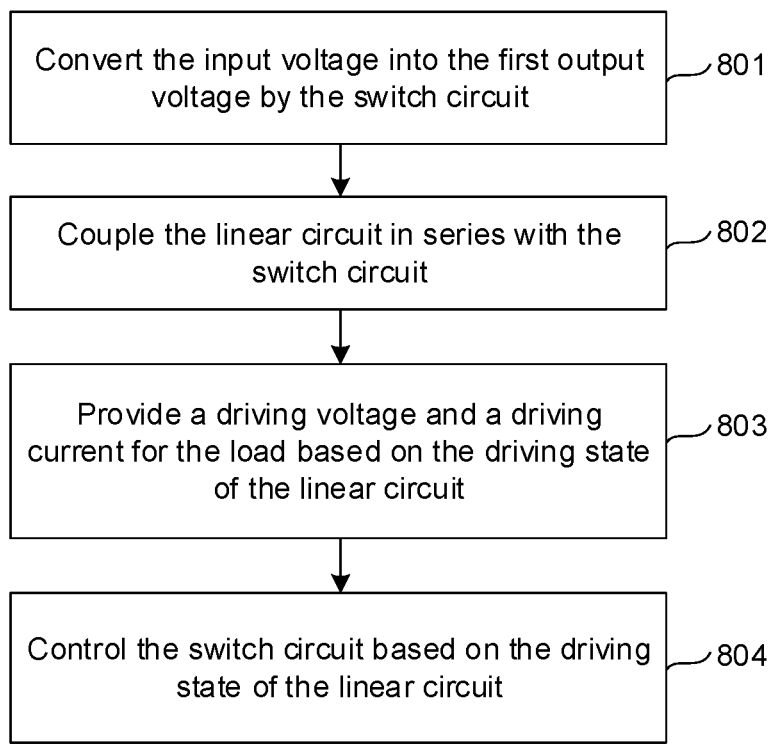
FIG. 8 illustrates a flow diagram of a load driving method according to an embodiment of the present invention.

FIG. 8 illustrates a flow diagram of a load driving method according to an embodiment of the present invention. The method includes the step 801 of converting the input voltage into the first output voltage by the switch circuit. In an embodiment, the input voltage is a direct current voltage. In an embodiment, the input voltage is the signal obtained by the full bridge rectifying and filtering of the AC power supply. In an embodiment, the average value of the first output voltage is less than the average value of the input voltage. In an embodiment, the first output voltage has a ripple which is similar to or corresponding to the input voltage. Wherein the switch circuit includes a switching transistor, which controls the first output voltage by controlling the duty cycle of the switching transistor. The method includes the step 802 of coupling the linear circuit in series with the switch circuit, wherein the linear circuit comprises a linear device, and controlling the driving voltage of the linear device to make the linear device work in the variable resistance region. The method includes the step 803 of providing the corresponding driving voltage and driving current for the load based on the driving state of the linear circuit, wherein the driving voltage is the voltage difference between two ends of the load. In an embodiment, the load includes the LED. Different LED loads have different driving voltages due to different number of LED in series. The brightness of LED can be adjusted by regulating the driving current. The method includes the step 804 of controlling the switch circuit based on the driving state of the linear circuit. In an embodiment, the step of controlling the switch circuit based on the driving state of the linear circuit includes the step of controlling the switching transistor of the switch circuit based on the feedback signal indicative of a difference value between the output voltage of the switch circuit and the driving voltage of the load. In an embodiment, the switching transistor can be controlled in accordance with the minimum value of the difference value, and the preset period can be half of the period of mains power, so that the system can reliably drive the load when the output voltage of the switch circuit has ripple. In an embodiment, the step of controlling the switch circuit based on the driving state of the linear circuit includes the step of controlling the switching transistor of the switch circuit based on the driving signal representing the driving state of the linear device. In an embodiment, the method of controlling the switch circuit based on the driving state of the linear circuit includes generating the logic signal in accordance with the feedback signal reflecting the driving state of the linear circuit, and controlling the switch circuit based on the logic signal. The logic signal can be used to make the control of the switch circuit based on the driving state of the linear circuit simple and easy. In an embodiment, the method of generating the logic signal based on the feedback signal includes getting the minimum value of the difference value between the first output voltage and the driving voltage of the load in the preset period, and generating the logic signal based on the minimum value. In an embodiment, the method of generating the logic signal based on the feedback signal includes: when the minimum value of the feedback signal is less than the first threshold in the preset period, it is set the logic signal as first logic level; and when the minimum value of the feedback signal is greater than the first threshold and less than the second threshold in the preset period, it is set the logic signal as the second logic level; when the minimum value of the feedback signal is greater than the second threshold in the preset period, it is set the logic signal as the third logic level; wherein the first threshold is less than the second threshold.

The advantages and effects in the description may not show in specific examples considering variable conditions and the results may further be affected by other factors as not mentioned.

It will be appreciated by persons skilled in the art that the present invention is not limited to what has been particularly shown and described herein above. Rather the scope of the present invention is defined by the claims and includes both combinations and sub-combinations of the various features described herein above as well as variations and modifications thereof which would occur to persons skilled in the art upon reading the foregoing description and which are not in the prior art.

I claim:

1. A load driving circuit, comprising:
   a switch circuit having a switching transistor, the switch circuit configured to convert an input voltage into a first output voltage based on a switching action of the switching transistor;
   a switch control circuit; and
   a linear circuit coupled in series with the switch circuit, the linear circuit having a linear device and configured to provide a driving voltage and a driving current for a load;
   wherein the load driving circuit is configured to control the switching transistor based on a feedback signal indicative of a conducting state of the linear device, and wherein the feedback signal is a logic signal, and the switch control circuit receives the logic signal, and wherein when the logic signal is at a first logic level, the switch control circuit controls the switching transistor to increase the first output voltage, and when the logic signal is at a second logic level, the switch control circuit controls the switching transistor to decrease the first output voltage.

2. The load driving circuit of claim 1, wherein the feedback signal represents a driving signal used to drive the linear device.

3. The load driving circuit of claim 1, wherein the driving voltage is a voltage difference between two ends of the load, and the feedback signal represents a difference value between the first output voltage and the driving voltage.

4. The load driving circuit of claim 3, wherein the load driving circuit controls the switching transistor based on a minimum value of the difference value in a preset period.

5. The load driving circuit of claim 4, wherein the preset period is half period of mains power.

6. The load driving circuit of claim 1, wherein
   when a minimum value of a difference value between the first output voltage and the driving voltage is less than a first threshold in a preset period, the logic signal is set as the first logic level to increase the first output voltage;
   when the minimum value is greater than the first threshold and less than a second threshold in the preset period, the logic signal is set as a third logic level to maintain the first output voltage; and
   when the minimum value is greater than the second threshold in the preset period, the logic signal is set as the second logic level to decrease the first output voltage;
   and wherein the first threshold is less than the second threshold.

7. The load driving circuit of claim 1, wherein the switch circuit comprises a buck converter.

8. The load driving circuit of claim 7, wherein a first end of the switching transistor is configured to receive the input voltage, a control end of the switching transistor is coupled to an output of the switch control circuit, and a second end of the switching transistor is coupled to a reference ground of the switch control circuit.

9. The load driving circuit of claim 1, wherein the linear circuit further comprises a linear control circuit, and wherein a first input of the linear control circuit is configured to receive a current sampling signal representing a current flowing through the linear device, a second input of the linear control circuit is configured to receive a reference signal, and an output of the linear control circuit is coupled to a control end of the linear device to provide a driving signal.

10. The load driving circuit of claim 1, further comprising a linear control circuit, wherein:
    the switch control circuit is fabricated on a first semiconductor substrate, the switch control circuit having an input configured to receive the feedback signal and an output coupled to a control end of the switch transistor;
    the linear control circuit is fabricated on a second semiconductor substrate, the linear control circuit having a first output coupled to a control end of the linear device and a second output configured to provide the logic signal.

11. The load driving circuit of claim 10, wherein a reference ground of the switch control circuit is different from a reference ground of the linear control circuit.

12. A method for driving a load, comprising:
    converting an input voltage into a first output voltage by a switch circuit;
    coupling a linear circuit in series with the switch circuit;
    providing a driving voltage and a driving current for a load based on a driving state of the linear circuit, wherein the driving voltage is a voltage difference between two ends of the load;
    generating a logic signal according to a feedback signal reflecting the driving state of the linear circuit; and
    controlling the switch circuit based on the driving state of the linear circuit according to the logic signal, and wherein when the logic signal is at a first logic level, the switching transistor is controlled to increase the first output voltage, and when the logic signal is at a second logic level, the switching transistor is controlled to decrease the first output voltage.

13. The method of claim 12, further comprising obtaining a minimum value of a difference value between the first output voltage and the driving voltage in a preset period; and generating the logic signal based on the minimum value.

14. The method of claim 12, further comprising:
    when a minimum value of the feedback signal is less than a first threshold in a preset period, the logic signal is set as the first logic level;
    when the minimum value is greater than a second threshold in the preset period, the logic signal is set as the second logic level; and
    when the minimum value is greater than the first threshold and less than the second threshold in the preset period, the logic signal is set as a third logic level;
    wherein the first threshold is less than the second threshold.

15. A switch control circuit for controlling a switching transistor of a switch circuit, the switch circuit configured to couple in series with a linear circuit for driving a load, the switch control circuit comprising a reference setting circuit, wherein the reference setting circuit generates a reference signal according to a logic signal configured to control the switching transistor, wherein the logic signal is generated according to a feedback signal indicative of a driving state of the linear circuit, and wherein when the logic signal is at a first logic level, the switch control circuit controls the switching transistor to increase the first output voltage, and when the logic signal is at a second logic level, the switch control circuit controls the switching transistor to decrease the first output voltage.

16. The switch control circuit of claim 15, wherein the logic signal is generated by a linear control circuit which is fabricated on a different semiconductor substrate from that for the switch control circuit.

* * * * *